(12) United States Patent
Tong

(10) Patent No.: US 8,732,629 B2
(45) Date of Patent: May 20, 2014

(54) METHOD AND SYSTEM FOR LITHOGRAPHY HOTSPOT CORRECTION OF A POST-ROUTE LAYOUT

(75) Inventor: Yang-Shan Tong, Taipei (CN)

(73) Assignee: Synopsys, Inc., Mountain View, CA (US)

( * ) Notice: Subject to any disclaimer, the term of this patent is extended or adjusted under 35 U.S.C. 154(b) by 0 days.

(21) Appl. No.: 13/503,748

(22) PCT Filed: Oct. 28, 2010

(86) PCT No.: PCT/IB2010/002760
§ 371 (c)(1),
(2), (4) Date: Apr. 24, 2012

(87) PCT Pub. No.: WO2011/051791
PCT Pub. Date: May 5, 2011

(65) Prior Publication Data
US 2012/0210280 A1    Aug. 16, 2012

(30) Foreign Application Priority Data

Oct. 30, 2009  (CN) .......................... 2009 1 0211373
Oct. 30, 2009  (CN) .......................... 2009 1 0211393

(51) Int. Cl.
*G06F 17/50*  (2006.01)

(52) U.S. Cl.
USPC .................... 716/55; 716/50; 716/51; 716/54

(58) Field of Classification Search
CPC ................. G06F 17/5068; G05B 2219/45031; G03F 1/144; G03F 1/36; G03F 1/22; G03F 1/14; G21K 1/06; G06T 2207/30148; G03C 1/52; B29C 67/0059
USPC .......................... 716/50–56; 378/34–35, 145; 382/144–145; 430/4, 8, 88; 700/120–121
See application file for complete search history.

(56) References Cited

U.S. PATENT DOCUMENTS 6,212,665 B1     4/2001  Zarkesh et al.
(Continued)

FOREIGN PATENT DOCUMENTS

CN         101308517 A     11/2008
(Continued)

OTHER PUBLICATIONS

Valerio Perez et al., 'Convergent Automated Chip Level Lithography Checking and Fixing at 45nm', Proceedings of SPIE, Mar. 2009, vol. 7275, pp. 72751S-72751S-10.

(Continued)

*Primary Examiner* — Stacy Whitmore
(74) *Attorney, Agent, or Firm* — Young, Basile, Hanlon & MacFarlane, P.C.

(57) ABSTRACT

Disclosed herein are correcting methods and devices for lithography hotspots of the post-routing layout, used for correcting lithography hotspots detected in the post-routing layout. At least one two-dimensional pattern of changeable size or position of the number of hotspots in the local area is selected and adjusted, so that the simulation value of the aerial image intensity of various local areas is optimized. The simulation value of the aerial image intensity is derived through calculation with respect to a set of optical simulation model cells that can be determined by the numerical value of distribution of the aerial image intensity of a number of basic two-dimensional patterns. After adjustment, the aerial image intensity of the local area can be calculated with respect to a set of optical simulation model cells, and a number of cells in the simulation model cells are selected to synthesize the two-dimensional pattern after the change.

25 Claims, 8 Drawing Sheets

(56) References Cited

U.S. PATENT DOCUMENTS

| | | | |
|---|---|---|---|
| 6,578,176 B1 | 6/2003 | Wang et al. | |
| 7,132,203 B2 | 11/2006 | Pierrat | |
| 7,194,704 B2 | 3/2007 | Kotani et al. | |
| 7,451,429 B2 | 11/2008 | Ikeuchi | |
| 7,503,029 B2 | 3/2009 | Sinha et al. | |
| 7,585,595 B2 | 9/2009 | Pierrat | |
| 7,636,904 B2 * | 12/2009 | Song et al. | 716/106 |
| 7,703,067 B2 | 4/2010 | Sinha et al. | |
| 7,823,099 B2 | 10/2010 | Tsai et al. | |
| 7,979,763 B2 | 7/2011 | Wohl et al. | |
| 7,984,397 B2 | 7/2011 | Lin et al. | |
| 8,037,428 B2 * | 10/2011 | Tong et al. | 716/51 |
| 8,209,154 B2 | 6/2012 | Bouaricha | |
| 8,209,639 B2 | 6/2012 | Sinha et al. | |
| 8,219,941 B2 | 7/2012 | Sinha et al. | |
| 8,347,239 B2 | 1/2013 | Miloslavsky et al. | |
| 8,464,115 B2 | 6/2013 | Wohl et al. | |
| 2006/0271907 A1 | 11/2006 | Izuha et al. | |
| 2008/0005704 A1 * | 1/2008 | Miloslavsky et al. | 716/2 |
| 2008/0098341 A1 | 4/2008 | Kobayashi et al. | |
| 2008/0109766 A1 * | 5/2008 | Song et al. | 716/2 |
| 2009/0144691 A1 | 6/2009 | Rathsack et al. | |
| 2009/0268958 A1 | 10/2009 | Kwang et al. | |
| 2009/0271749 A1 | 10/2009 | Tang et al. | |
| 2009/0300561 A1 * | 12/2009 | Tong et al. | 716/5 |
| 2009/0307642 A1 * | 12/2009 | Lai et al. | 716/5 |
| 2010/0180251 A1 * | 7/2010 | Ye et al. | 716/19 |
| 2011/0191725 A1 | 8/2011 | Oberai | |
| 2012/0210280 A1 | 8/2012 | Tong | |
| 2012/0269421 A1 * | 10/2012 | Ye et al. | 382/144 |
| 2012/0272201 A1 * | 10/2012 | Lai et al. | 716/112 |

FOREIGN PATENT DOCUMENTS

| | | |
|---|---|---|
| CN | 101821641 A | 9/2010 |
| CN | 101971179 A | 2/2011 |
| EP | 1299771 B1 | 3/2011 |
| JP | 5044703 B2 | 10/2012 |
| TW | 201017193 A | 5/2010 |
| TW | 201028876 A | 8/2010 |

OTHER PUBLICATIONS

Notification Concerning Transmittal, dated May 10, 2012, International Preliminary Report on Patentability and Written Opinion of the International Searching Authority from corresponding International Application No. PCT/IB2010/002760.

* cited by examiner

METHOD AND SYSTEM FOR LITHOGRAPHY HOTSPOT CORRECTION OF A POST-ROUTE LAYOUT

TECHNICAL FIELD

The present invention relates to a correcting method and system for lithography hotspots of the post-routing layout, particularly to a method and its system to improve lithography hotspots by means of simulating the optical intensity of the local area where the lithography hotspots are located.

BACKGROUND

With the continuous progress in the manufacturing technology of integrated circuits (IC), the minimum size of IC chips also keeps going down. However, with this trend in the physical design of reducing chip sizes, it is more necessary to consider the impact of manufacturability on the yield and reliability. Particularly with the introduction of advanced nano-class processes, many problems in the yield and reliability may be caused by certain layout patterns, or may be known of as process hotspots or hotspots. These patterns are easily affected by the recipe of the manufacturing process, such as change in stress and lithographic process, thus causing various defects (open circuits or short circuits) in the layout. Therefore, it is necessary to be able to identify these patterns, and even to modify these patterns to help with increasing the yield.

The major cause for difficulty in increasing the yield recently is an increase by a large margin of the number of hotspots in the lithographic process, which is a problem due to complexity of the layout design, when the technology nodes are reduced to less than 65 nm. Although the problem of these lithography hotspots can be treated with resolution enhancement technology during an optical proximity correction (OPC) phase, and improvements are made by modifying the wire design at the lithography hotspots, a huge number of computer computations are required in this phase, and the changeable amplitude of the wire design is obviously inadequate, that is, lithography hotspots cannot be entirely eliminated by means of optical proximity correction. If the presence of lithography hotspots can be considered in an earlier phase of the flow process of design, this will be more helpful for enhancing the efficiency of the overall design, and for ensuring the solution of the problem of hotspots.

Generally speaking, current layout designers will try to find hotspots using a design standard provided by the wafer manufacturer, such as: the lithography rule check, and can modify the wire design at the lithography hotspot to meet the requirements of said standard. However, this method to detect and modify hotspots purely relying on the standard is very likely to lead to the incorrect detection of hotspots. The problem of incorrect detection is becoming more and more serious with an increase in the number of design standards, and especially if an IC design uses a manufacturing process below 65 nm, this problem is even more serious.

Traditional methods to correct lithography hotspots in wire layouts as mentioned above are mostly after the optical proximity correction phase, but because it takes a lot of time to adjust the recipe in the optical proximity correction process, and modifying the wire is not very elastic, therefore if the effect of optical lithography can also be considered before other earlier phases, such as: the post-routing phase, then the difficulty of traditional methods can be improved.

Currently there is a pattern-matching based method that is a correcting method after the wiring phase to correct the presence of lithography hotspots in the wire layout. Because this method uses pattern matching, it needs to set up many pattern databases. Yet actually there is no way to include all patterns that may cause lithography hotspots, and therefore only limited lithography hotspots can be identified and modified. As a result, the proportion of hotspots that are modified is too low. Furthermore, this kind of pattern database not only takes up a huge amount of storage, but also requires verification of and experiments on different patterns of various kinds, thus costing a lot of time. It is obvious that this technology of testing and modifying hotspots is similar to manual modification, and as its use is limited and correction guidance information of the design standard is not taken into consideration, many cycles of errors and corrections (trial and error) must be performed before it can bring about a slightly better result. In fact, this technology cannot attain fast and effective, high-percentage correction results of hotspots, that is, it is really difficult for the circuit designer to execute this highly manual method successfully within a limited time.

Therefore, the electronic design automation industry needs an automatic and efficient lithography hotspot correcting method, in order to solve the problems that are encountered in current circuit design.

SUMMARY

The purpose of the present invention is to eliminate the lithography hotspots found in the layout after routing, so as to enhance the yield and reliability of IC design, and to increase the efficiency for executing electronic design automation.

A correcting method of lithography hotspots of post-routing layout based on an example comprises steps as follow: Accepting lithographic inspection of the post-routing layout of a chip to obtain the data of a number of hotspots; Selecting at least one two-dimensional pattern of changeable geometric size or position within the local area where each one of said number of hotspots is located, and defining the mode to change said geometric size or position as a number of change modes; Based on the change amount of each one of said number of change modes within the allowable range, selecting in sequence a number of model cells from a set of optical simulation model cells of aerial image intensity to synthesize the corresponding aerial image intensity; Determining the optimal change amount of each one of said number of change modes corresponding to said hotspot in accordance with a number of aerial image intensity values mentioned above of said aerial image intensity; and Obtaining respectively a set of optimal change modes and the optimal change amount of said optimal change mode for said two-dimensional pattern of each one of said number of hotspots in said local area.

The present example also comprises the step to realize said set of optimal change modes and the optimal change amount of each said optimal change mode that said two-dimensional pattern corresponds to in the local area where each one of said number of hotspots is located.

The present example also comprises the step to check if said change mode and its optimal change amount violate the design rule check or the layout versus schematic, after determining the change amount of each one of said number of change modes that corresponds to said hotspot.

Another example of the correcting method of lithography hotspots of post-routing layout, comprises the following steps: to accept lithographic inspection of the post-routing layout of a chip to obtain the data of a number of hotspots; to select at least one two-dimensional pattern of changeable geometric size or position within the local area where each one of said number of hotspots is located, and to define the mode to change said geometric size or position as a number of change modes; based on the change amount of each one of said number of successive change modes within the allowable range, to select in sequence a number of model cells from a set of optical simulation model cells of aerial image intensity to synthesize, by means of superimposition, the two-dimensional pattern after the change, so as to obtain the corresponding aerial image intensity of the change amount of each one of said number of change modes; to determine the optimal change amount of each one of said number of change modes corresponding to said hotspot in accordance with said number of aerial image intensity values; and a correcting device to obtain and realize a set of optimal change modes and the optimal change amount of said optimal change mode for said two-dimensional pattern of said local area where each one of said number is located.

In the present example, said set of set of optical simulation model cells of aerial image intensity are set up through the following steps: setting the basic simulation parameters; applying a consistent adding device structure calculation to obtain two-dimensional distribution values of the aerial image intensity of a number of basically geometric patterns; dividing each said two-dimensional distribution value by the area where said two-dimensional distribution value is located into a number of subsets of values; fitting the curve of each subsets of values using a binary multiple function; and storing the functional coefficient of said two-dimensional distribution value of said aerial image intensity that each basically geometric pattern corresponds to represent each said optical simulation model cell.

The aerial image intensity that the change amount of each one of said number of change modes of the two-dimensional pattern is obtained through the following steps: to select a said change mode of said two-dimensional pattern and to set a change amount; to select a number of model cells from said set of optical simulation model cells for superimposition of the two-dimensional pattern of said set change amount of said change mode selected; to calculate the aerial image intensity of said changed two-dimensional pattern versus said hotspot with respect to the method of superimposition mentioned above; when said successive change amount has reached said allowable range, then to confirm completion of calculation of the aerial image intensity of various change amounts of said change mode of said two-dimensional pattern.

Another example of the correcting device system for the lithography hotspots of the post-routing layout, which is characterized by the fact that it comprises: a hotspot inspecting device, to accept lithographic inspection of the post-routing layout of a chip to obtain data of a number of hotspots; a pattern selecting device, to select at least one two-dimensional pattern of changeable geometric size or position within the local area where each one of said number of hotspots is located, and defining the mode to change said geometric size or position as a number of change modes; an intensity calculating device comprising a model synthesizing cell and an intensity calculating cell, wherein said model synthesizing cell provides itself a set of optical simulation model cells and selects from them a number of model cells for superimposition of the two-dimensional pattern of the set change amount of said selected change mode, and said intensity calculating cell calculates the aerial image intensity of said changed two-dimensional pattern in relation to the hot spot with respect to the result of superimposition mentioned above; a comparing device, to determine the optimal change amount of each one of said number of change modes corresponding to said hotspot in accordance with said number of aerial image intensity values; a correcting device, to obtain respectively a set of optimal change modes and the optimal change amount of said optimal change mode for at least one said two-dimensional pattern in said local area where each one of said number of hotspots is located, and to realize said set of optimal change modes and the optimal change amount of said optimal change mode for at least one said two-dimensional pattern.

The correcting method and device of the present invention for lithography hotspots of the post-routing layout are capable of automatic and efficient correction of lithography hotspots, to eliminate in the layout after post-routing the lithography hotspots that have been found, thus enhancing the yield, and reliability of IC design, and efficiency to realize electronic design automation, and also enhancing the overall computation efficiency because computation is simpler.

DETAILED DESCRIPTION

The direction of the present invention discussed here is a correcting method and system for lithography hotspots of the post-routing layout. In order to understand the present invention thoroughly, detailed steps and composition will be provided in the following description. It is obvious that the application or implementation has not defined special details familiar to technical personnel of circuit design. However, known compositions or steps have not been described in detail so as to avoid unnecessary limitation of the embodiments. Embodiments of the invention will be described below in details, but these embodiments can also be extensively applied in other examples, and the range of the present invention is not to be limited, and is based on the claims later.

Figure 1:
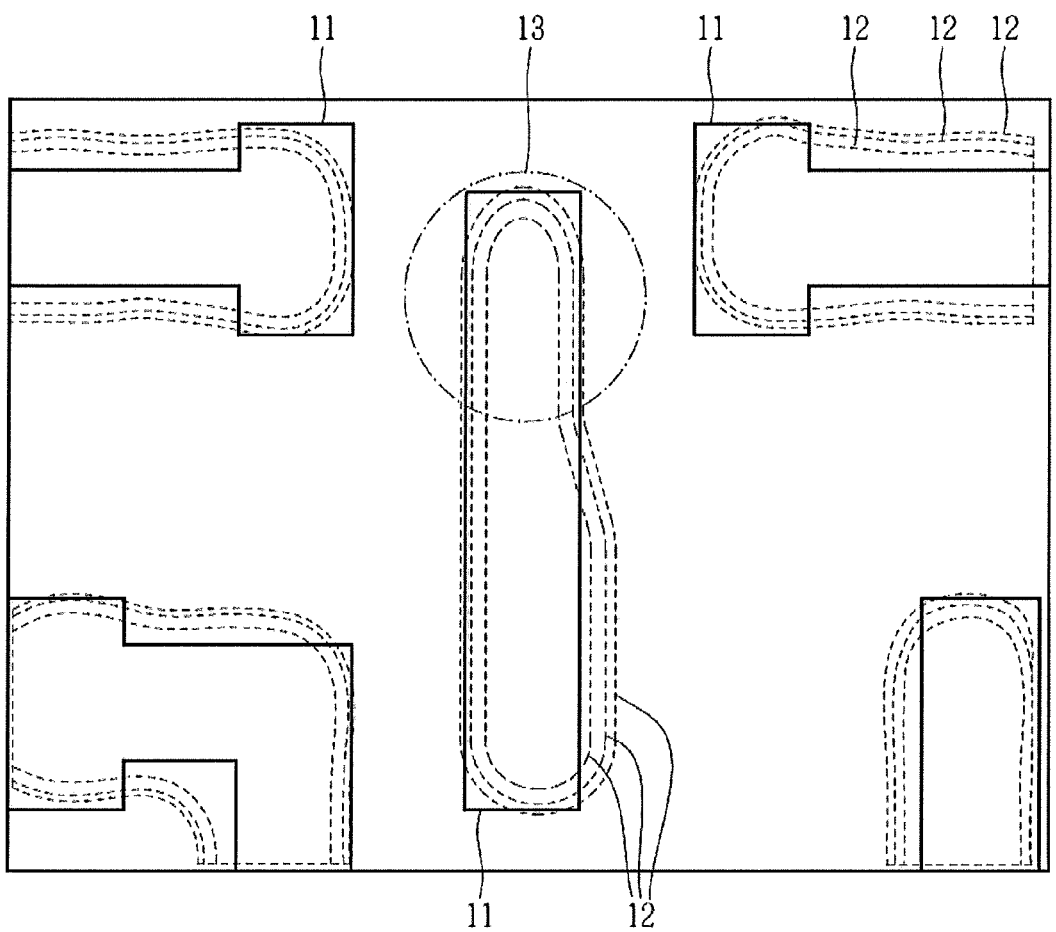
FIG. 1 is to show the lithography hotspots in a local post-routing layout.

FIG. 1 shows the lithography hotspots in a local post-routing layout. The linear outline 11 in the drawing is of the original design, and the arc multiple outline 12 is a different result derived through simulation with respect to different recipes within the process window. Besides, the circled part 13 in the drawing is the area where the lithography hotspot mentioned above is located. When the recipe changes, the wire inside the circle becomes narrower very noticeably, and even may even open. Even if the wire does not open, more heat will be generated when the electric current goes through said narrow part of the wire, and there will come the problem of reliability after it has been used for a certain period of time.

The purpose of the present invention is to eliminate in the layout after routing, so as to enhance the yield, and reliability of IC design, and efficiency to realize electronic design automation. And as these lithography hotspots can be found out in the post-routing layout through execution of lithography compatibility or compliance checking (LCC) using tools of regular commercial software (such as: Prime Yield sold by Synopsys Inc.), therefore methods of identification of hotspots will not be discussed here in the present article.

Figure 2:
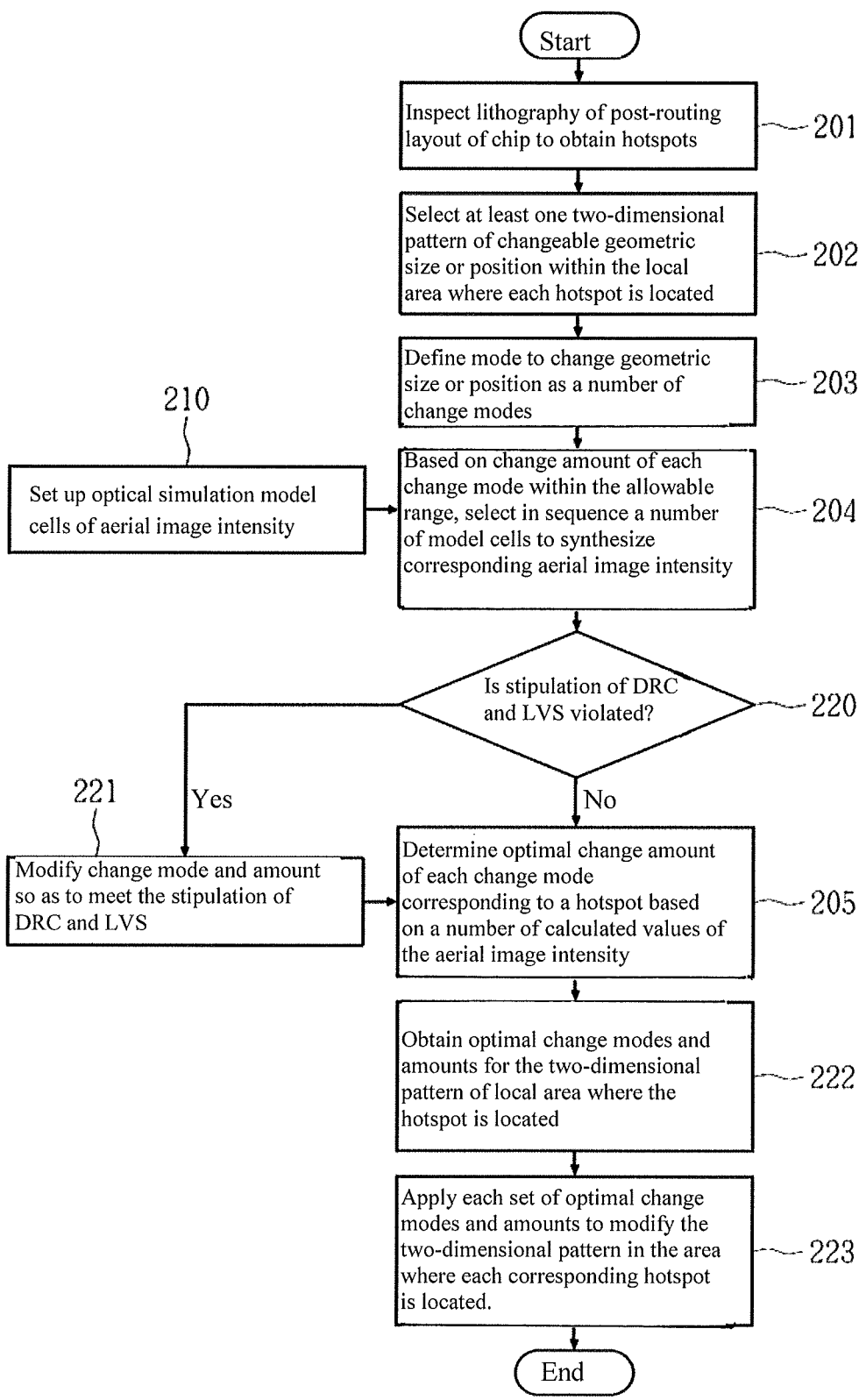
FIG. 2 is a flow chart of the correction method of lithography hotspots of the post-routing layout based on an example of the present invention.

FIG. 2 is a flow chart of the correction method of lithography hotspots of the post-routing layout based on an example of the present invention. After the step of placement and routing in electronic design automation, the designer will obtain an IC layout, and then can find out data of hotspots that may be present in the wire can be found out through execution of lithography checking using the software tool mentioned above, as shown in Step 201. Said information of hotspots of the present example can be obtained through execution of lithography checking, or direct acceptance of input of the data of hotspots.

Then, as shown in Step 202, at least one wire of polygon or two-dimensional pattern with changeable geometric size and position is selected from the local area where each one of said number of hotspots is located. The size of said local area in the present example covers a range within two pitches or so from the center of said hotspot, and each pitch is equivalent to 200 nm or so.

The two-dimensional pattern with changeable geometric size and position can be a wire or a hole. If it is a wire, then there may be three ways of change: extension or contraction in the vertical direction of the wire, extension or contraction in the lateral direction of the wire, or shift in the vertical or lateral direction of the wire. If it is a hole, then in principle it can move in any directions, though the wires connected above the hole and below the hole respectively, too, need to move with it. However, if various ways of change mentioned above violate the stipulation of the design rule check, then they will be ruled out or the changed layout of the violation portion will be tailored and modified. This section of description is only an illustration of the principle for some geometric sizes or position changes, and has not covered all possible cases.

Figure 3:
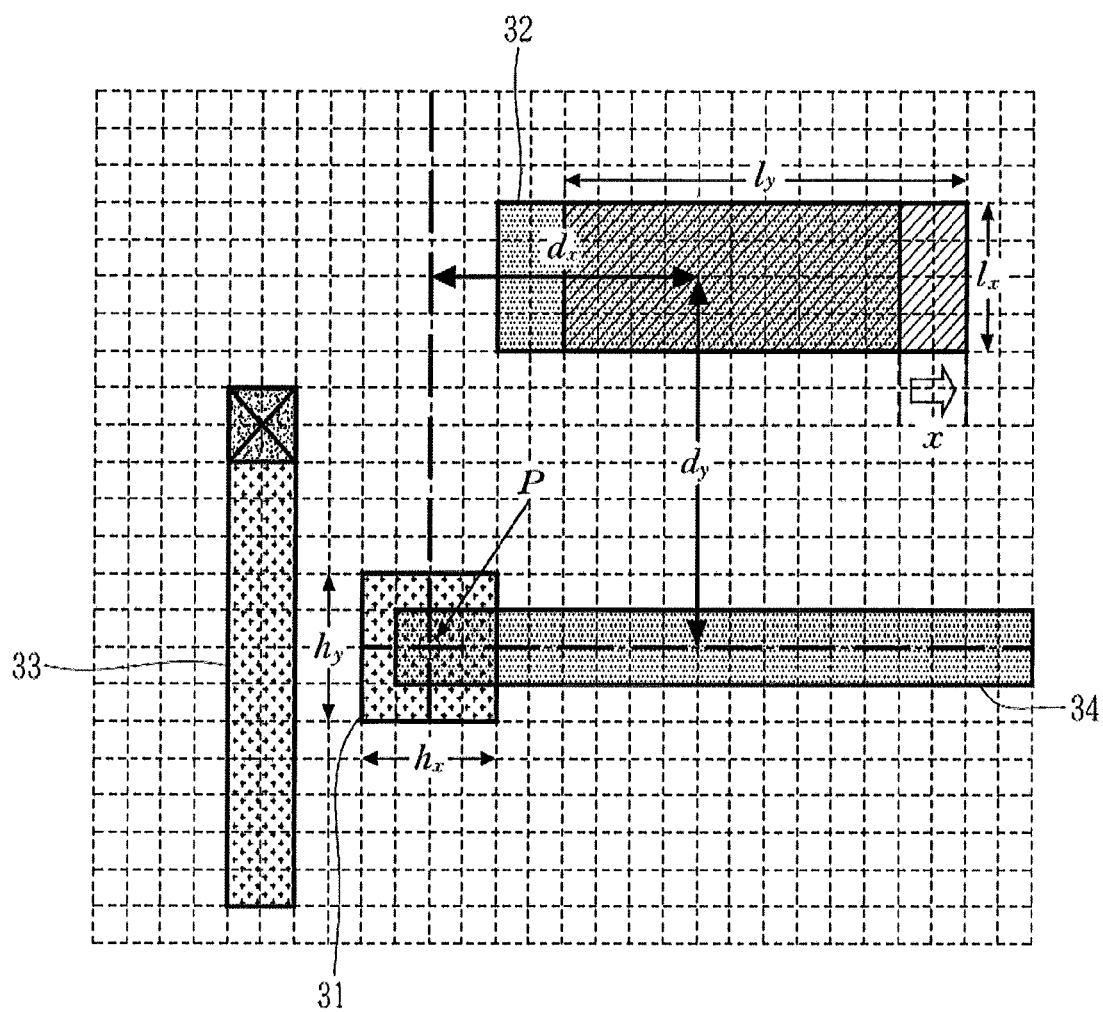
FIG. 3 is an illustration of the hotspots of the post-routing layout and the changeable two-dimensional pattern adjacent to it based on an example of the present invention.

As is shown in FIG. 2 03, a designer can define in accordance with the principle of change mentioned above the way of change of the geometric size or position of each two-dimensional pattern into a number of change modes. Then, based on the change amount of each one of said number of change modes within the allowable range, for example, the maximum shift amount in a single direction is 1 pitch, the change amount in incremented and in sequence within this allowable range, and part of the cells from a set of optical simulation model cells of aerial image intensity that have already been provided are selected to synthesize the corresponding aerial image intensity, as shown in Step 204.

Figure 5:
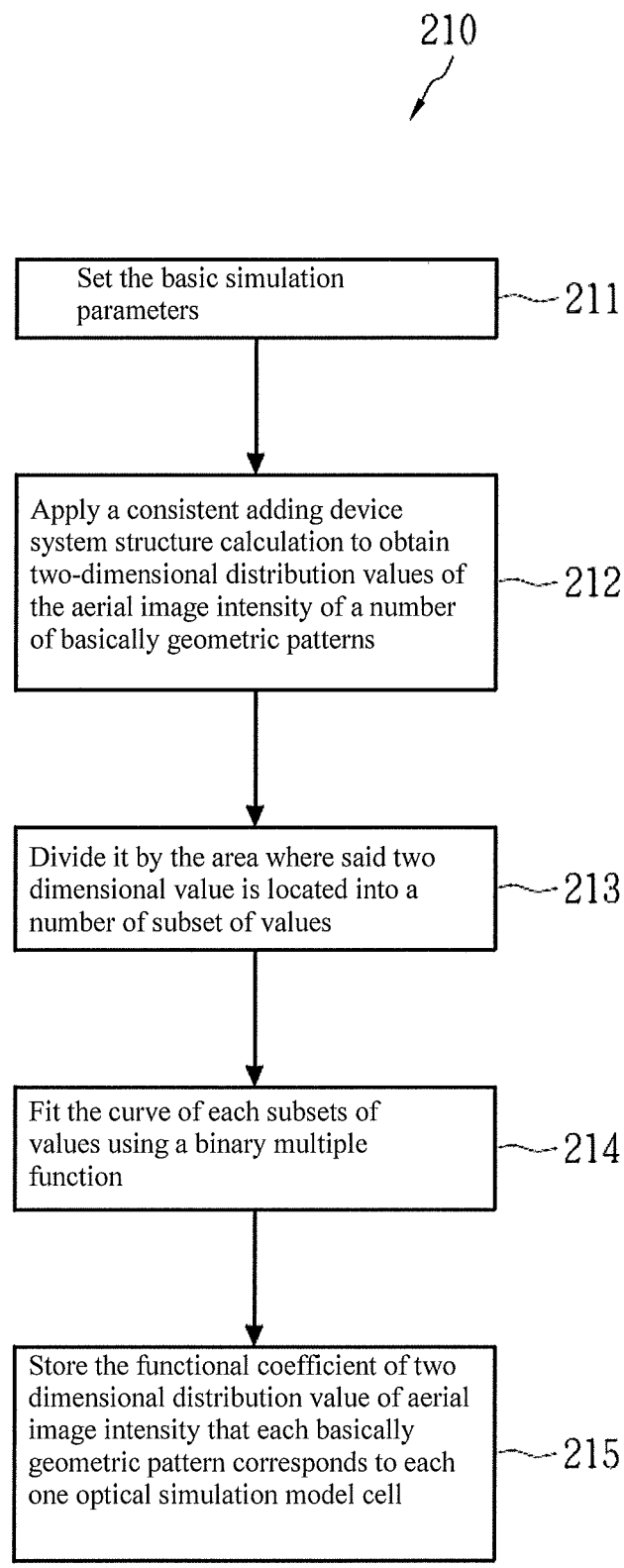
FIG. 5 is a setup flow chart of the set of optical simulation model cells of the aerial image intensity based on an example of the present invention.

Said aerial image intensity can be derived through calculation with respect to a set of optical simulation model cells of aerial image intensity (Step 210), while for setup of said set of optical simulation model cells of aerial image intensity, see FIG. 5 and subsequent detailed description. Said set of optical simulation model cells of aerial image intensity is pre-defined (Step 210), while said set of optical simulation model cells can be generated using the flow process in FIG. 5. Step 204 in the present example is to select a number of model cells from set of optical simulation model cells of aerial image intensity, to synthesize said changed two-dimensional pattern with said number of model cells, and to calculate the aerial image intensity a the hotspot based on the result of this synthesis.

When the change amount of each one of said number of change modes within the allowable range is not in compliance with the stipulation of the design rule check or the layout versus schematic, then the local wire not in compliance needs to be tailored to meet said stipulation, as shown in Steps 220 and 221. On the contrary, tailoring is not necessary if there is no incompliance with said stipulation. For actual operation of this, see FIGS. 4A~4B and subsequent detailed description.

Each one of said number of change modes will have different change amounts within the allowable range. Therefore, based on the increase and decrease of the change amount, there will be a number of calculated values of aerial image intensity generated. Then, based on the above-mentioned calculated values of said aerial image intensity, the optimal change amount that each one of said number of change modes corresponds to will be determined. See Step 205. Besides, the aerial image intensity can also be indicated using a function, and then said function is differentiated to obtain the extreme as the optimal value. The so-called optimal change amount refers to the fact that its corresponding calculated value of the aerial image intensity has the optimal effect on elimination of the hotspots, said calculated value may be the maximum or the minimum, depending on the direction required to eliminate the various hotspot problems (short or open).

If there are a number of two-dimensional patterns with changeable geometric size and position in the local area where each one of said number of hotspots is located, then for each two-dimensional pattern, with respect to the result of Step 205, the optimal change amount of various change modes can be found out. But through a comparison of the calculated values of the aerial image intensity of these optimal change amounts, an optimal change mode can be obtained, and this step can also be known as the fix action. Therefore, a set of optimal change modes and these optimal change amounts can be respectively obtained for these two-dimensional patterns of said local area where each one of said number of hotspots is located, as shown in Step 222. That is, there is always an optimal change mode and its optimal change amount for each two-dimensional pattern in the local area, and the gathering of this optimal combination may be known as the fix guidance. Then said set of optimal change modes and their optimal change amounts that said two-dimensional pattern corresponds to for said local area is realized where each one of said number of hotspots is located, so that the calculated value of the aerial image intensity of the area of said hotspot becomes the optimal, that is, the problem of the hotspots will be eliminated, as shown in Step 223.

FIG. 3 is an illustration of the hotspots of the post-routing layout and the changeable two-dimensional pattern adjacent to it based on an example of the present invention. Point P is the central point of Hotspot 31, and the length and width of the area of said Hotspot 31 is respectively hy and hx. In the drawing, Wires 33 and 34 are unchangeable two-dimensional patterns; and Wire 32 is a changeable two-dimensional pattern, and its length and width are respectively ly and lx, and the component or product of the distance of its central point to Point P is dx and dy. In the present example, said wire 32 can move in the direction of the arrowhead for a maximum change amount of x, and in the drawing is the position after the wire 32 moves rightward for x as indicated by the slanting line. It can be further divided by the maximum change amount and the manufacturing grid into a number of incremental change amounts x1, x2, etc., wherein the manufacturing grid is in accordance with the one provided by the wafer manufacturing plant, for example, the manufacturing grid for a manufacturing process of 65 nm is 1-5 nm. With the position of the wire 32 with different moving amounts, the area of hotspot 31 is integrated respectively to obtain the calculated value of the aerial image intensity. Through a comparison of said calculated value with the calculated value of the wire 32 before it is moved, a gain can be obtained, and through said intensity gain, it is possible to determine how much the optimal change amount is.

Figure 4A:
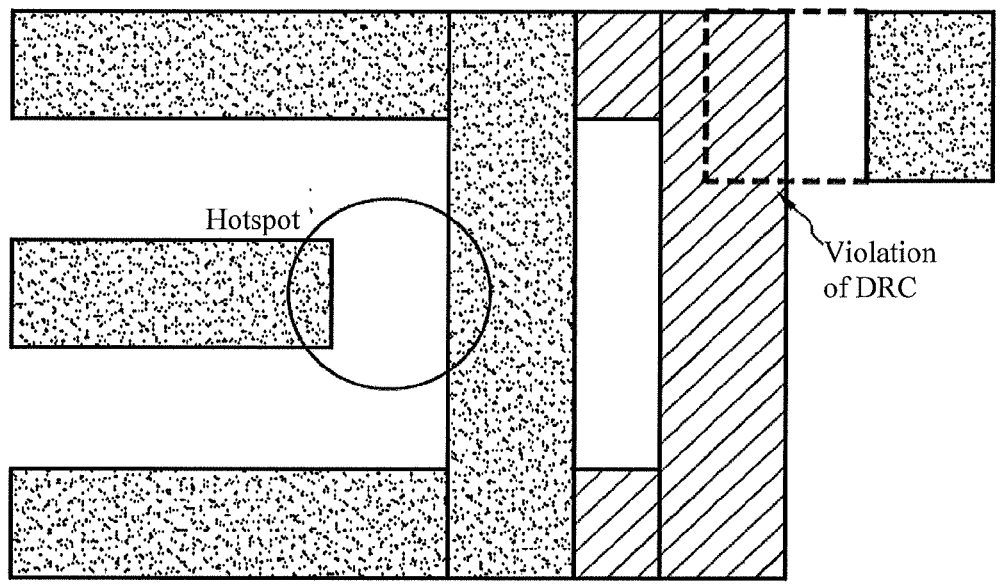
FIG. 4A~4B are schematic diagrams of tailoring and modification of the fix action.
Figure 4B:
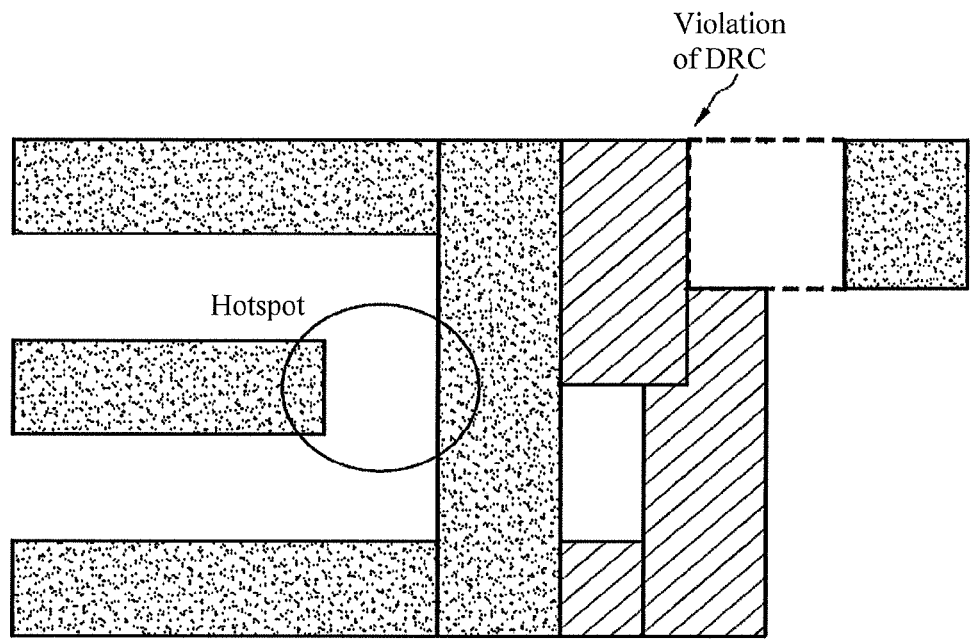

FIG. 4A~4B are schematic diagrams of tailoring and modification of the fix action. In the drawing, the area circled is where the hotspot is. When the changeable two-dimensional pattern extends in the direction of the arrowhead for a change amount, the upper rectangular corner portion will be too close to the wire on the farthest right side, thus being not in compliance with the design rule check. Therefore, the local wire of the corner can be tailored and modified to meet said stipulation, for example, moving the change amount of said local wire out of the range not in compliance with the design rule check (indicated by the dotted line block), as shown in FIG. 4B.

FIG. 5 is a setup flow chart of the set of optical simulation model cells of the aerial image intensity based on an example of the present invention. First of all, it needs to set the basic simulation parameter, wherein said basic simulation parameter comprises light wavelength, numerical aperture, and coherence factor, as shown in Step 211. A same set value in the optical proximity correction bypass (OPC-bypass) simulation can be used. Said light wavelength is 120 nm, said numerical aperture is 0.8 and said coherence factor σcenter=0.825 and σwidth=0.25.

See Step 212, wherein a consistent cumulating or adding device system structure calculation can be applied to obtain two-dimensional distribution values of the aerial image intensity of a number of basically geometric patterns. The basically geometric pattern can be a long bar pattern with one end fixed while the other end extending infinitely, or rectangular with two boundaries which are mutually vertical fixed and two boundaries which are mutually vertical extending infinitely. For the method of said consistent cumulating or adding device system structure calculation, please refer to "Exploiting Structure in Fast Aerial Image Computation for IC Patterns," an article by Y. C. Pati, A. A. Ghazanfarian, and R. F. Pease published on February 1997 on IEEE Trans. Semi. Mfg., vol, 10 (1), pages 62-74, and "Fast Optical and Process Proximity Correction Algorithms for Integrated Circuit Manufacturing," an article by N. B. Cobb published in the PhD Dissertation.

The two-dimensional distribution value of said aerial image intensity is selected from a proper range of said aerial image intensity with greater successive change, and based on the range of around two pitches from the center of said hotspot as mentioned above, plus the maximum change amount of the two-dimensional pattern which is 1 pitch, and plus the safe range for the two-dimensional pattern to locate in the boundary which is 1 pitch, the proper range of 8×8 pitch can be derived.

Furthermore, each two-dimensional distribution value can be divided by the area where said two-dimensional distribution value is located into a number of subsets of values, as shown in Step 213. Said two-dimensional distribution value may also be divided by the areas arranged in 8×8 matrix into 64 subsets of values. As shown in Step 214, the curve of each subsets of values is fitted using a binary multiple function, and said curve is known as a sub-preimage, while a curve that originally has not been divided is known as a preimage. Then, the functional coefficient of said two-dimensional distribution value of said aerial image intensity that each basically geometric pattern corresponds to is stored to serve as each optical simulation model cell, that is, the coefficient of the fitting function of each aerial image is stored to indicate a complete aerial image intensity, as shown in Step 215.

Figures 6A, 6B:
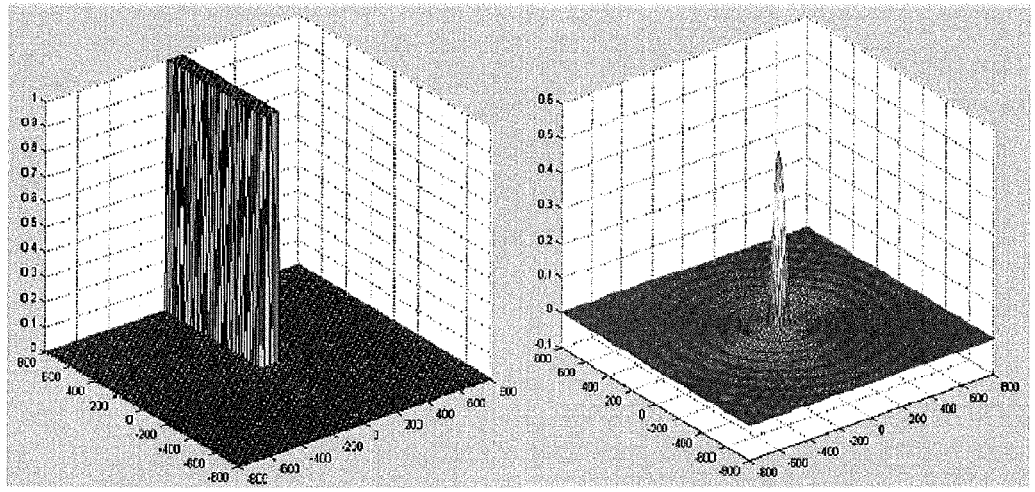
FIG. 6A~6D are illustration of setup of optical simulation model cells of the basically geometric aerial image intensity.

FIG. 6A~6D are illustration of setup of optical simulation model cells of the basically geometric aerial image intensity. FIG. 6A is the pattern of a two-dimensional step function, and the two-dimensional step function can be used to indicate a wire with a certain width, and with the other end extending infinitely. The geometric patterns of wires of said width but different in length can be obtained through deduction of this kind of step function of two different fixed ends.

The basic formula to calculate the aerial image intensity 1 is as follows:

$$I = |f \otimes k|^2 \quad (1)$$

Wherein ⊗ stands for the convulsion operator; f stands for the mask transmission function; and k stands for the transmission function. The formula of the aerial image intensity of each point can be re-written with respect to Formula (1) as follows:

$$I(x_i, y_i) \approx \sum_{k=1}^{n} \alpha_k |(f \otimes \phi_k)(x_i, y_i)|^2 \quad (2)$$

Wherein $\phi_k$ stands for eigenfunction, which is the kernel function of the consistent cumulating system structure; and $\alpha_k$ stands for the eigenvalue of each eigenfunction. The aerial image intensity of a certain area can be obtained after area integration of Formula (2).

Figures 6C, 6D:
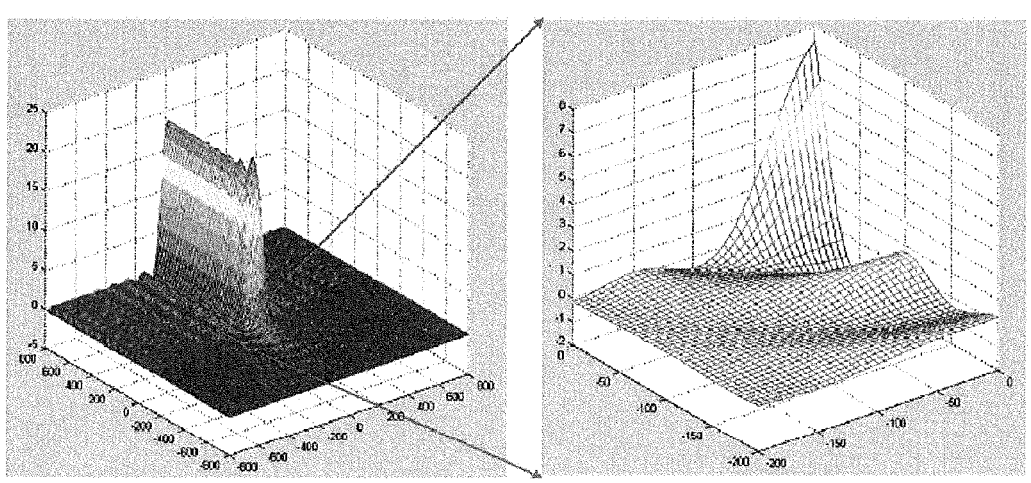

The two-dimensional step function in FIG. 6A is f in Formula (2), and the pattern of its two-dimensional projection is the basically geometric pattern called in the present example. And the pattern in FIG. 6B is the pattern of the first kernel function, and up to the fifth kernel function will be used in normal calculation. Kernel functions after the fifth kernel function do not have much effect, therefore they can be left out of account. FIG. 6C is the result after convolution operator of the two-dimensional step function and the first kernel function, that is, the curve generated by the two-dimensional distribution value of an aerial image intensity is obtained.

FIG. 6D is the sub-aerial image wherein the aerial image in FIG. 6C into 64 equal areas (one area covers an area of 200 nm×200 nm). The curve of said sub-aerial image is fitted using the binary multiple function of the following formula (3):

$$I(x,y) \approx a_{k,0}x^k + a_{k-1,1}x^{k-1}y^1 + \ldots + a_{0,k}y^k + a_{k-1,0}x^{k-1} + \ldots$$
$$+ a_{0,k-1}y^{k-1} + \ldots + a_{1,0}x + a_{0,1}y + a_{0,0} \quad (3)$$

Therefore when the fitting coefficient $a_{i,j}$ of the binary multiple function of each sub-aerial image stored is then simply placed back to Formula (3), said complete binary multiple function can be obtained, that is, the two-dimensional distribution value of said original sub-aerial image can be obtained. The storage space required to store the fitting coefficient $a_{i,j}$ is much smaller than the storage space required by other traditional methods, while the integration calculation of the binary multiple function is also pretty simply, therefore the overall calculation efficiency can also be enhanced.

Figure 7:
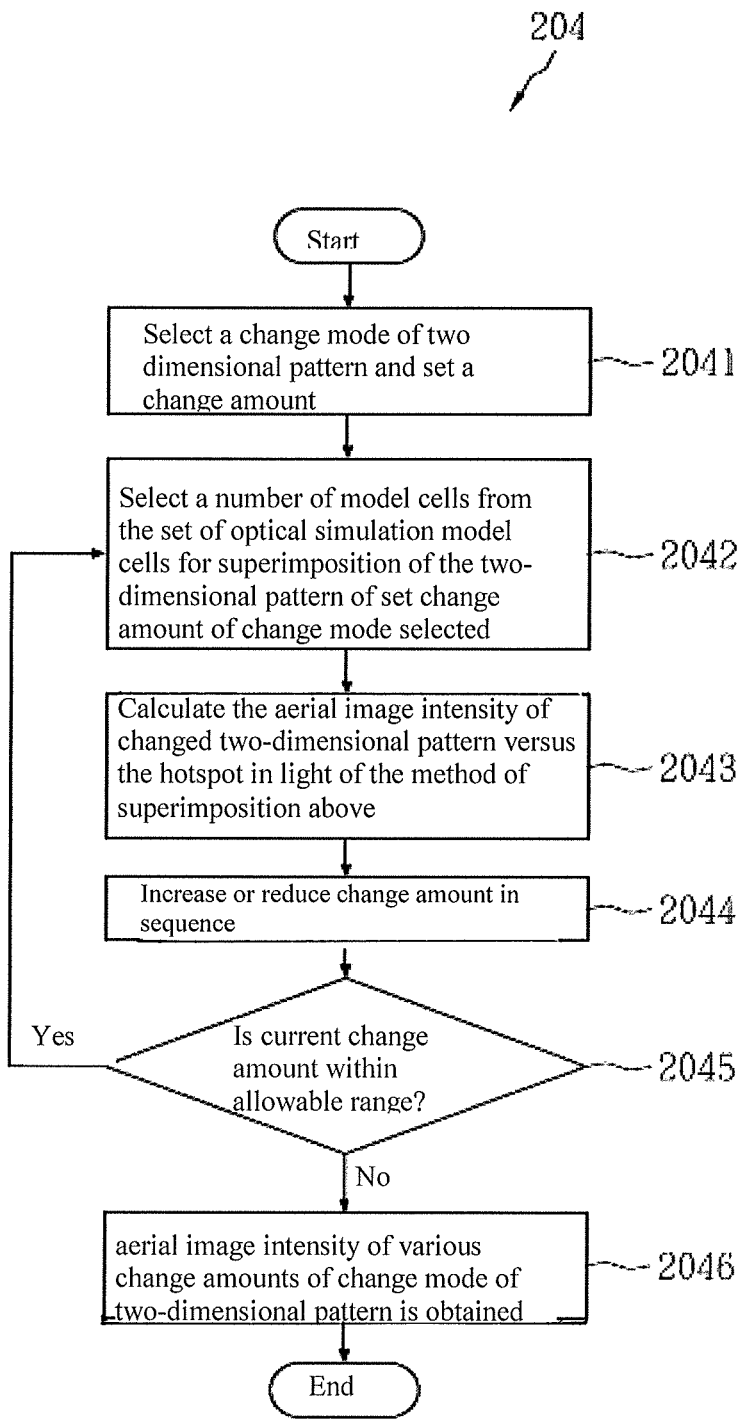
FIG. 7 is a flow chart of calculation of the corresponding aerial image intensity values of different change amounts of a change mode of the two-dimensional pattern based on an example of the present invention.

FIG. 7 is a flow chart of calculation of the corresponding aerial image intensity values of different change amounts of a change mode of the two-dimensional pattern based on an example of the present invention. As shown in Step 2041, there may be at least one changeable two-dimensional pattern in the local area wherein each one of said number of hotspots is located, and a change mode of said two-dimensional pattern is selected and a change amount is set. For example, the wire 32 in FIG. 3 first moves in the arrowhead direction for the change amount of a multiple of the manufacturing grid. Then, in accordance with what is described in Step 2042, a number of model cells are selected from said set of optical simulation model cells, before generating the two-dimensional pattern of the set change amount of said selected change mode by means of superimposition of said number of model cells. For example, the wire 32 can be obtained through reduction with two two-dimensional step functions with different initial values (See FIG. 6A; the width should be consistent with that of the wire 32), that is, said two initial values are the left side and right side of the wire 32, therefore reduction can be made with the model of the aerial image intensity simulating and approximating said two two-dimensional step functions, to obtain the simulation status of intensity distribution on the optical lithography caused by the wire 32. Superimposition here is defined as where different geometric patterns are positioned one above the other or the overlap is deleted.

In addition to use of the two-dimensional step function mentioned above to generate the simulation model cell, the optical simulation model cell can also be generated the step-like function with ¼ plane discretely rising, and the wire 32, similarly, can be obtained through superimposition of three step-like functions different in the original point and with ¼ plane [discretely rising]. A comparison of this method with the previous two-dimensional step function shows that it can reduce storage of the amount of data.

As in Step 2044, the change amount of said change mode of said two-dimensional pattern is then changed in sequence successively, for example, the wire 32 in FIG. 3 moves further in the arrowhead direction for the change amount of the same multiple of the manufacturing grid. When the change amount of the successive change has reached said allowable range, for example, the wire 32 move rightward accumulatively to the maximum change amount x, then it is confirmed that calculation of the aerial image intensity of each change amount of said change mode of said two-dimensional pattern is completed, as shown in Steps 2045 and 2046. If it has not reached the maximum change amount x, then go back to Step 2042 to execute the calculation of simulation and next change amount and the aerial image intensity.

Figure 8:
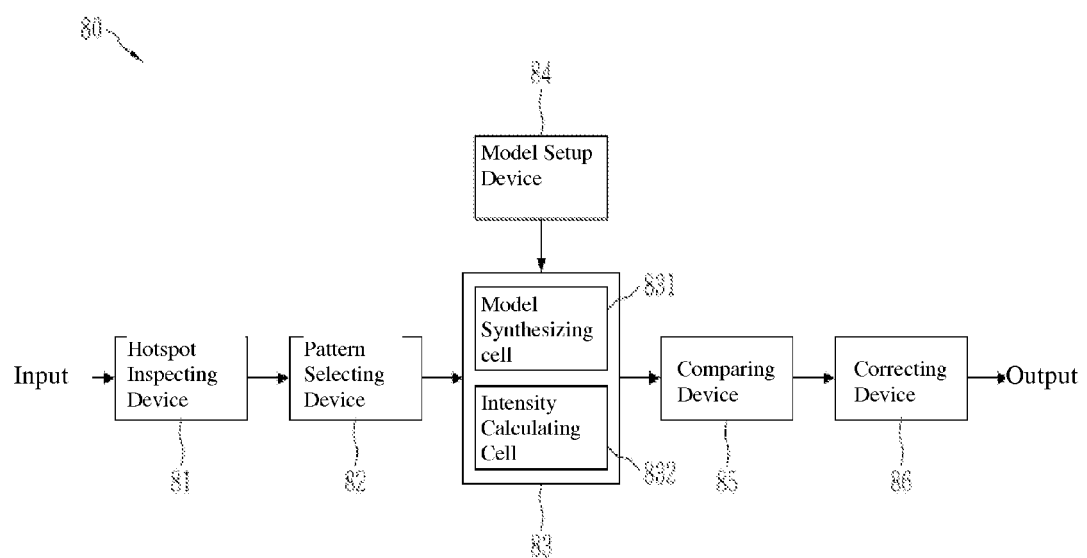
FIG. 8 is the drawing of the correcting system for lithography hotspots of the post-routing layout based on an example of the present invention.

FIG. 8 is the drawing of the correcting system for lithography hotspots of the post-routing layout based on an example of the present invention. The correcting system 80 comprises a hotspot inspecting device 81, a pattern selecting device 82, an intensity calculating device 83, a model setup device 84, a comparing device 85 and a correcting device 86. After input of the data of the post-routing layout of a chip, the hotspot inspecting device 81 will execute lithography inspection and obtain the analytical data of a number of hotspots. Said analytical data will be input to the pattern selecting device 82, to select at least one two-dimensional pattern of changeable geometric size or position within the local area where each one of said number of hotspots is located, and to define the mode to change said geometric size or position as a number of change modes. The intensity calculating device 83 comprises a model synthesizing cell 831 and an intensity calculating cell 832, wherein the model synthesizing cell 831 can derive through calculation the corresponding aerial image intensity value based in sequence on a set of optical simulation model cells, based on the change amount within the allowable range of each change mode of each two-dimensional pattern input by the pattern selecting device. The model synthesizing cell 831 can select from said set of optical simulation cells a number of model cells to superimpose the two-dimensional pattern of the set change amount of said change mode selected, and said intensity calculating cell 832 calculates the aerial image intensity of said changed two-dimensional pattern in relation to said hotspot in accordance with the result of superimposition mentioned above. Said change amount will increments or decrements in sequence in the allowable range, therefore the aerial image intensity within the allowable range of each change mode of each one of said two-dimensional patterns can be obtained. Said set of optical simulation model cells are generated by the model setup device 84. The comparing device 85 then compares a number of aerial image intensity values mentioned above, to determine the optimal change amount of each one of said number of change modes corresponding to said hotspot. The correcting device 84 obtains and realizes a set of optimal change modes and the optimal change amount of each optimal change mode for said two-dimensional pattern in said local area wherein each one of said number of hotspots is located, thus completing correction of lithography hotspots of the post-routing layout.

The technical content and technical features of the present invention have been disclosed as above, but those familiar with this technology, based on the instruction and disclosure of the present invention, can still make various replacements and modifications without deviating from the spirit of the present invention. Therefore, the scope of the claim of the embodiments herein should not be restricted to that disclosed in the examples, but should include various replacements and modification which do not deviate from the present invention, and be covered by the claims below.

What is claimed is:

1. A method for correcting a lithography hotspot of a post-routing layout comprising:
    selecting at least one two-dimensional pattern within a local area of a hotspot;
    defining at least one change mode to change the at least one two-dimensional pattern, each change mode having an allowable range of amount of change;
    selecting model cells from a set of optical simulation model cells of aerial image intensity;
    synthesizing with a computer a corresponding aerial image intensity of the at least one two-dimensional pattern with the selected model cells;
    optimizing the amount of change of each change mode based on aerial image intensity values of a corresponding aerial image intensity; and
    comparing aerial image intensity values of each optimized amount of change to obtain a set of optimal change modes for the at least one two-dimensional pattern.

2. The method according to claim 1, further comprising:
    checking if a change mode and a corresponding optimized allowable range of amount of change violates a design rule check or a layout versus schematic.

3. The method according to claim 2, further comprising:
    modifying the change mode to satisfy the design rule check or the layout versus schematic if the change mode and the corresponding optimized allowable range of amount of change are in violation.

4. The method according to claim 1, wherein the at least one change mode changes a geometric size of the at least one two-dimensional pattern by increasing or decreasing one or more of a length and a width.

5. The method according to claim 1, wherein the at least one change mode changes a position of the at least one two-dimensional pattern by shifting in two vertical directions.

6. A method for correcting a lithography hotspot of a post-routing layout comprising:
    defining change modes to change a geometric size or a position of at least one two-dimensional pattern within a local area of a hotspot;

based on a change amount of each of the change modes within an allowable range, selecting in sequence a number of model cells from a set of optical simulation model cells of aerial image intensity;

synthesizing a changed two-dimensional pattern to obtain an aerial image intensity corresponding to different change amounts of each of the change modes;

determining, by a computer, an optimal change amount of each of the change modes for the hotspot based on aerial image intensity values of the corresponding aerial image intensity; and obtaining a set of optimal change modes each with the optimal change amount for the at least one two-dimensional pattern.

7. The method according to claim 6, wherein obtaining the aerial image intensity corresponding to the different change amounts comprises:

selecting a change mode of a two-dimensional pattern and setting the change amount;

selecting the number of model cells from the set of optical simulation model cells;

comparing the two-dimensional pattern with the number of model cells to generate a changed two-dimensional pattern;

calculating the aerial image intensity of the changed two-dimensional pattern in relation to the hotspot; and changing the change amount in sequence and repeating from the step of selecting the number of model cells until the change amount reaches the allowable range.

8. The method according to claim 7, wherein comparing comprises:

superimposing the number of model cells or deleting an overlapped portion to obtain the changed two-dimensional pattern.

9. The method according to claim 6, wherein the optical simulation model cells are a result of simulating the aerial image intensity of two-dimensional step functions different in an initial value and in a width.

10. The method according to claim 6, wherein the optical simulation model cells are a result of simulating the aerial image intensity of step-like functions different in an original point and with a ¼ plane discretely rising.

11. The method according to claim 6, wherein the set of optical simulation model cells is set up through the following steps:

setting basic simulation parameters;

calculating a consistent cumulating system structure based on the basic simulation parameters to obtain two-dimensional distribution values of the aerial image intensity of basic geometric patterns;

dividing each of the two-dimensional distribution values by an area where the two-dimensional value is located to obtain a subset of values;

fitting a curve of the subset of values using a binary multiple function to obtain a functional coefficient; and storing the functional coefficient of the two-dimensional distribution value of the aerial image intensity to serve as one of the optical simulation model cells.

12. The method according to claim 11, wherein the basic geometric patterns include a long bar pattern with one end fixed while another end extends infinitely.

13. The method according to claim 11, wherein the basic simulation parameters comprise a light wavelength, a numerical aperture, and a coherence factor.

14. The method according to claim 13, wherein the light wavelength is 120 nm, the numerical aperture is 0.8 and the coherence factor is $\sigma_{center}=0.825$ and $\sigma_{width}=0.25$.

15. A method of circuit analysis, comprising:

obtaining data representing at least one lithographic hotspot associated with a post-routing layout;

determining an optical simulation to synthesize an aerial image intensity of at least one property of the at least one lithographic hotspot; and determining, by a computer, at least one change for the at least one lithographic hotspot based on the aerial image intensity, wherein the at least one change includes at least one change mode for the at least one property and at least one change amount for the at least one change mode.

16. The method of claim 15, wherein determining the optical simulation comprises:

selecting at least one optical simulation model cell from a set of optical simulation model cells of aerial image intensity; and synthesizing a corresponding aerial image intensity with the selected at least one optical simulation model cell.

17. The method of claim 15, wherein the at least one property comprises a geometric pattern associated with the post-routing layout.

18. The method of claim 17, wherein the at least one geometric pattern is a two-dimensional pattern of changeable size or position.

19. The method of claim 15, further comprising:

determining an optimal change amount for each of the at least one change mode based on calculated values of the aerial image intensity for the optical simulation.

20. The method of claim 19, wherein the optimal change amount is determined such that a corresponding calculated value of the aerial image intensity has an optimal effect on eliminating the at least one lithographic hotspot.

21. The method of claim 19, further comprising:

determining an optimal change mode by comparing the optimal change amount determined for each of the at least one change mode.

22. A computer program product embodied in a non-transitory computer readable medium for circuit analysis having stored thereon a program of instructions executable by one or more processors to cause the one or more processors to:

obtain data representing at least one lithographic hotspot associated with a post-routing layout;

determine an optical simulation to synthesize an aerial image intensity of at least one property of the at least one lithographic hotspot; and determine, by a computer, at least one change for the at least one lithographic hotspot based on the aerial image intensity, wherein the at least one change includes at least one change mode for the at least one property and at least one change amount for the at least one change mode.

23. The computer program product of claim 22, wherein the instructions to determine the optical simulation to synthesize the aerial image intensity of at least one property of the at least one lithographic hotspot comprise instructions to:

select at least one optical simulation model cell from a set of optical simulation model cells of aerial image intensity; and synthesize a corresponding aerial image intensity with the selected at least one optical simulation model cell.

24. The computer program product of claim 22, further comprising instructions executable by one or more processors to cause the one or more processors to:

determine an optimal change amount for each of the at least one change mode based on calculated values of the aerial image intensity for the optical simulation.

25. The computer program product of claim 24, further comprising instructions executable by one or more processors to cause the one or more processors to:

determine an optimal change mode by comparing the optimal change amount determined for each of the at least one change mode.

\* \* \* \* \*